United States Patent
Yasuda

(12) 
(10) Patent No.: US 9,203,040 B2
(45) Date of Patent: Dec. 1, 2015

(54) DRIVING CIRCUIT BOARD, METHOD OF MANUFACTURING THE SAME, DISPLAY UNIT, AND ELECTRONIC APPARATUS

(71) Applicant: Sony Corporation, Tokyo (JP)

(72) Inventor: Ryouichi Yasuda, Kanagawa (JP)

(73) Assignee: Sony Corporation, Tokyo (JP)

( * ) Notice: Subject to any disclaimer, the term of this patent is extended or adjusted under 35 U.S.C. 154(b) by 55 days.

(21) Appl. No.: 14/349,613

(22) PCT Filed: Oct. 4, 2012

(86) PCT No.: PCT/JP2012/075846
§ 371 (c)(1),
(2) Date: Apr. 3, 2014

(87) PCT Pub. No.: WO2013/054740
PCT Pub. Date: Apr. 18, 2013

(65) Prior Publication Data
US 2014/0239286 A1 Aug. 28, 2014

(30) Foreign Application Priority Data
Oct. 13, 2011 (JP) ................................ 2011-226170

(51) Int. Cl.
*H01L 35/24* (2006.01)
*H01L 51/00* (2006.01)
*H01L 51/05* (2006.01)
*H01L 27/32* (2006.01)
*G02F 1/1345* (2006.01)

(52) U.S. Cl.
CPC ........ *H01L 51/0512* (2013.01); *G02F 1/13454* (2013.01); *H01L 27/3274* (2013.01); *H01L 51/0541* (2013.01)

(58) Field of Classification Search
CPC ............ H01L 27/3274; H01L 51/0512; H01L 51/0541; G02F 1/13454; G02F 1/136277
USPC .......................................................... 257/40
See application file for complete search history.

(56) References Cited

U.S. PATENT DOCUMENTS

| | | | |
|---|---|---|---|
| 2002/0119584 A1 | 8/2002 | Duthaler et al. | |
| 2003/0047729 A1 | 3/2003 | Hirai et al. | |
| 2010/0133572 A1* | 6/2010 | Hirai | ............................... 257/98 |
| 2010/0283044 A1 | 11/2010 | Inoue | |

FOREIGN PATENT DOCUMENTS

JP 06-194689 7/1994

(Continued)

*Primary Examiner* — David S Blum
(74) *Attorney, Agent, or Firm* — K&L Gates LLP

(57) ABSTRACT

There are provided a driving circuit board and a method of manufacturing the same as well as a display unit and an electronic apparatus in which a number of forming steps is small and usage efficiency of materials is improved. The display unit includes: a pair of source-drain electrodes; an organic semiconductor layer forming a channel region in contact with the source-drain electrodes; an insulating layer having a through hole penetrating to the source-drain electrodes, and the insulating layer on the organic semiconductor layer and the source-drain electrodes; a gate electrode provided at a position corresponding to the channel region; and a pixel electrode electrically connected to the source-drain electrodes through the through hole, the pixel electrode being made of a same material as the gate electrode with a same film thickness as the gate electrode, and the pixel electrode on the insulating layer.

20 Claims, 15 Drawing Sheets

(56) References Cited

FOREIGN PATENT DOCUMENTS

| | | |
|---|---|---|
| JP | 2003-505889 | 2/2003 |
| JP | 2003-179234 | 6/2003 |
| JP | 2010-283332 | 12/2010 |
| JP | 2011-097007 | 5/2011 |

* cited by examiner

DRIVING CIRCUIT BOARD, METHOD OF MANUFACTURING THE SAME, DISPLAY UNIT, AND ELECTRONIC APPARATUS

CROSS REFERENCES TO RELATED APPLICATIONS

The present application is a national stage of International Application No. PCT/JP2012/075846 filed on Oct. 4, 2012 and claims priority to Japanese Patent Application No. 2011-226170 filed on Oct. 13, 2011, the disclosure of which is incorporated herein by reference.

BACKGROUND

The present disclosure relates to a driving circuit board mounted with, for example, a top gate thin film transistor (TFT) and a pixel electrode, and a method of manufacturing the driving circuit board, as well as a display unit and an electronic apparatus that have the driving circuit board.

In recent years, a TFT using an organic semiconductor as a channel has been developed. A method of manufacturing a TFT using an inorganic semiconductor as a channel is diverted to a method of manufacturing the TFT using the organic semiconductor as the channel. Specifically, a semiconductor layer is formed using a vacuum evaporator or a sputtering apparatus. However, the facility cost thereof is high when these apparatuses are used, and thus a manufacturing method that is less in equipment investment, is simplified, and covers a large area has been developed. As an example, a technology of forming a channel layer by an applying and printing system has been developed by making use of soluble property of the organic semiconductor. The applying and printing system is applicable not only to formation of the semiconductor layer, but also to formation of an insulating layer and wirings that configure the TFT, and is considered to be differentiated from an inorganic TFT in cost.

In addition, the organic semiconductor is gradually improved in basic property such as mobility as compared with that of the inorganic semiconductor, and it is reported that the organic semiconductor has property equivalent to or more than the property of an amorphous silicon depending on materials. In this way, it is considered that the TFT become more common than ever before as the organic TFT using the organic semiconductor with high performance is decreased in cost. For example, it is possible to allow books, newspapers, magazines that currently mainly cope with still images, to cope with moving images with the same price. Moreover, it is possible to achieve a situation where a still image display body that is disposable or is assumed to be kept for a short period, such as an admission ticket and other tickets is allowed to display moving images. As described, to allow the display body capable of performing moving display to become common to the society, it is necessary to further suppress the price of the TFT controlling the display body.

To suppress the price of the organic TFT, it is conceivable that cost reduction of use materials, improvement in material usage efficiency, simplification of the TFT structure, and reduction of manufacturing steps by simplification are effective, in addition to use of an applying and printing method with lower cost as a method of forming the channel layer, as described above. Here, as the structure of the organic TFT now under development, a bottom gate (inverted staggered) structure as illustrated in, for example, PTL 1 is mainstream.

CITATION LIST

Patent Literature

PTL 1: Japanese Unexamined Patent Application Publication No. 2011-97007

SUMMARY

However, as for the organic TFT having the structure described in the PTL 1, a large number of manufacturing steps is necessary and usage efficiency of the materials is disadvantageously low.

Therefore, it is desirable to provide a driving circuit board and a method of manufacturing the same as well as a display unit and an electronic apparatus in which a number of forming steps is small and usage efficiency of materials is improved.

According to an embodiment of the present disclosure, there is provided a driving circuit board including: a pair of source-drain electrodes; an organic semiconductor layer forming a channel region, and provided in contact with the source-drain electrodes; an insulating layer formed of one or more layers, the insulating layer having a through hole penetrating to the source-drain electrodes, and the insulating layer being provided on the organic semiconductor layer and the source-drain electrodes; a gate electrode provided at a position corresponding to the channel region; and a pixel electrode electrically connected to the source-drain electrodes through the through hole, the pixel electrode being made of a same material as the gate electrode with a same film thickness as the gate electrode, and the pixel electrode being provided on the insulating layer.

According to an embodiment of the present disclosure, there is provided a first method of manufacturing a driving circuit board including the following steps (A) to (E):
(A) forming source-drain electrodes;
(B) forming an organic semiconductor layer on a part of the source-drain electrodes, the organic semiconductor layer having a channel region;
(C) forming an insulating layer on the source-drain electrodes and the organic semiconductor layer;
(D) forming a through hole in the insulating layer, the through hole penetrating to the source-drain electrodes; and
(E) forming a gate electrode and a pixel electrode on the insulating layer with use of a same material with a same film thickness.

According to an embodiment of the present disclosure, there is provided a second method of manufacturing a driving circuit board including the following steps (A) to (E):
(A) forming an organic semiconductor layer having a channel region;
(B) forming source-drain electrodes on the organic semiconductor layer;
(C) forming an insulating layer on the source-drain electrodes and the organic semiconductor layer;
(D) forming a through hole in the insulating layer, the through hole penetrating to the source-drain electrodes; and
(E) forming a gate electrode and a pixel electrode on the insulating layer with use of a same material with a same film thickness.

According to an embodiment of the present disclosure, there is provided a display unit including the driving circuit board according to the embodiment of the present disclosure and a display layer driven by the driving circuit board.

According to an embodiment of the present disclosure, there is provided an electronic apparatus including a driving circuit board driven by the driving circuit board according to the embodiment of the present disclosure.

In the driving circuit board and the method of manufacturing the same as well as the display unit and the electronic apparatus that include the driving circuit board according to the respective embodiments of the present disclosure, the gate electrode and the pixel electrode are formed of the same material with the same film thickness in the same forming step, which reduces the number of forming steps and improves the usage efficiency of the materials.

In the driving circuit board and the method of manufacturing the same as well as the display unit and the electronic apparatus that include the driving circuit board according to the respective embodiments of the present disclosure, the gate electrode and the pixel electrode are formed in the same forming step. Therefore, the gate electrode and the pixel electrode are formed of the same material with the same film thickness. In other words, the manufacturing steps are simplified to reduce the number of forming steps, and the usage efficiency of the materials is improved. Therefore, the manufacturing cost of the display unit and the electronic apparatus that have the driving circuit board is reduced.

Additional features and advantages are described herein, and will be apparent from the following Detailed Description and the figures.

DETAILED DESCRIPTION

Some embodiments of the present disclosure will be described in detail below with reference to drawings. Note that description will be given in the following order.
1. First Embodiment
    Display unit in which gate electrode and pixel electrode are provided on planarizing layer
2. Second Embodiment
    Display unit in which channel protection layer doubles as planarizing layer, and gate electrode and pixel electrode are formed on channel protection layer
3. Third Embodiment
    Display unit in which opening is provided on planarizing layer, and gate electrode is provided in opening
4. Fourth Embodiment
    Display unit provided with TFT having top contact structure
5. Modification 1
6. Modification 2
7. Application examples 1 to 6

1. First Embodiment

Structure of Display Unit 1

Figure 1:
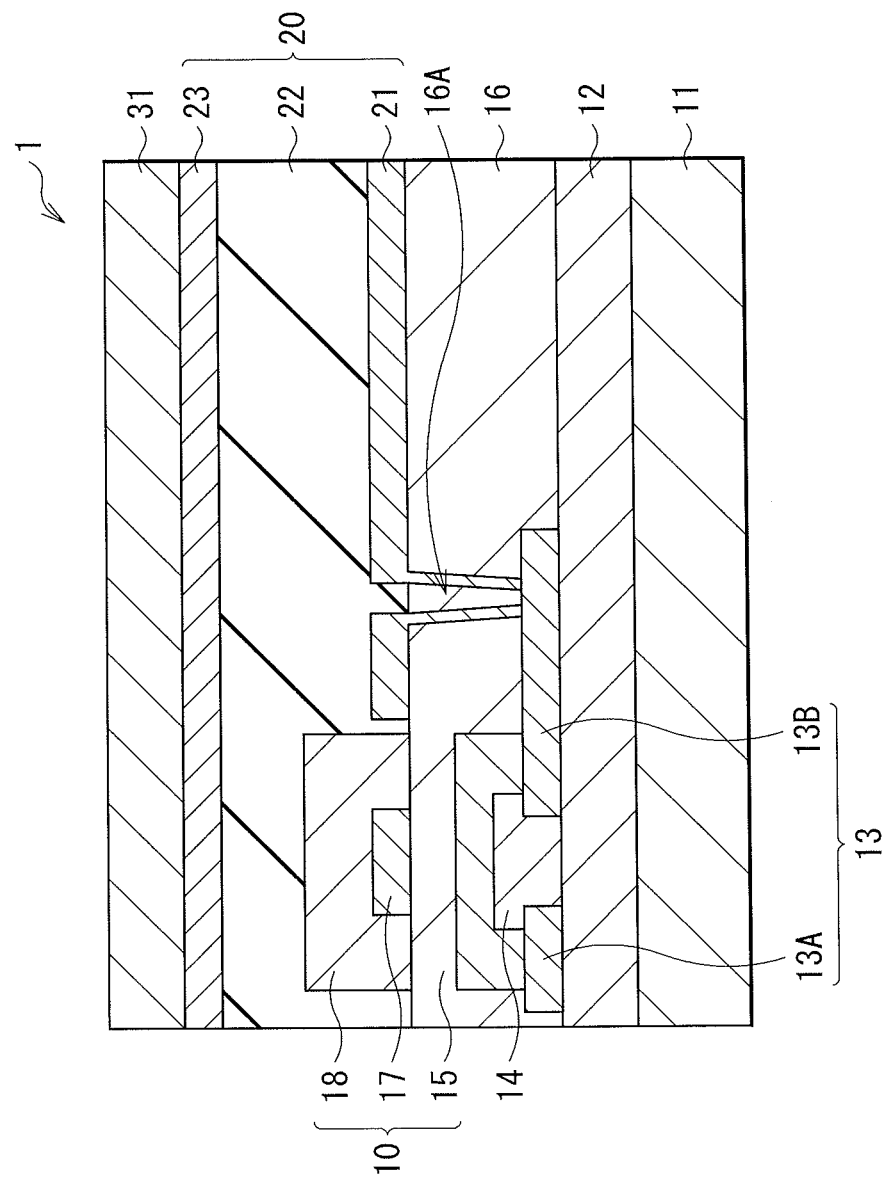
FIG. 1 is a sectional diagram illustrating a structure of a display unit according to a first embodiment of the present disclosure.

FIG. 1 illustrates a sectional structure of a display unit 1 that has a display layer 20 on a driving circuit board (a TFT layer 10), according to a first embodiment of the present disclosure. For example, the display unit 1 may be an electrophoretic display (a so-called electronic paper display) that uses electrophoresis phenomenon to display an image (for example, literal information), and has a structure in which the TFT layer 10 and the display layer 20 are stacked on a board body (substrate) 11. In the present embodiment, a gate electrode 17 of the TFT layer 10 and a pixel electrode 21 (an electrode for pixel) of the display layer 20 are formed of the same material with same film thickness. Note that FIG. 1 schematically illustrates the structure of the display unit 1, and the dimensions and the shape thereof are different from actual dimensions and actual shape.

The board body 11 supports the TFT layer 10 and the display layer 20, and may be formed of, for example, an inorganic material such as glass, quartz, silicon, and gallium arsenide, or a plastic material such as polyimide, polyethylene terephthalate (PET), polyethylene naphthalate (PEN), polymethyl methacrylate (PMMA), polycarbonate (PC), polyether sulfone (PES), polyethylethyl ketone (PEEK), and aromatic polyester (liquid crystal polymer). The board body 11 may be a rigid board such as a wafer, or a flexible board such as a thin layer glass and a film. Moreover, it is only necessary for the board body 11 to have a certain thickness, and specifically, the board body 11 may preferably have a thickness of, for example, 1 μm to 700 μm both inclusive.

The planarizing layer 12 is to reduce irregularity (for example, irregularity equal to or larger than the thickness of the layers and the like formed on the board, or steep irregularity) of the surface of the board body 11, and to prevent unintentional disconnection of a source-drain electrode 13 and the like that are formed on the board body 11. In addition, the planarizing layer 12 has a function of preventing deterioration of the TFT layer 10 and the display layer 20 caused by moisture and organic gas. Examples of a specific material of the planarizing layer 12 may include, for example, a silicon oxide ($SiO_2$), a silicon nitride ($Si_3N_4$), an aluminum oxide ($Al_2O_3$), an aluminum nitride (AlN), a tantalum oxide ($Ta_2O_5$), and an aluminum oxynitride ($AlO_XN_{1-X}$ (where X=0.01 to 0.2)). In addition, the material of the planarizing layer 12 is not limited to the above-described inorganic materials, and the planarizing layer 12 may be formed of organic materials such as polyvinyl alcohol (PVA), polyvinyl phenol (PVP), a novolac resin, an acrylic resin, and a fluorine-based resin. The planarizing layer 12 may be formed with use of a CVD apparatus, an atomic layer deposition (ALD) apparatus, a pulsed laser deposition (PLD) apparatus, a sputtering apparatus, an EB deposition apparatus, an ion plating apparatus, or the like. Note that the planarizing layer 12 is not necessarily provided, and may be omitted as appropriate.

The TFT layer 10 has a top gate type TFT structure, and has the source-drain electrode 13, an organic semiconductor layer 14, a channel protection layer 15, a planarizing layer 16, and the gate electrode 17 in order from the board body 11 side. Incidentally, the gate electrode 17 is covered with a protection layer 18 having an insulation property. Accordingly, insulation with respect to the picture electrode 21 of the display layer 20 described later is ensured.

The source-drain electrode 13 (13A and 13B) may be formed of, for example, metals such as gold (Au), silver (Ag), copper (Cu), molybdenum (Mo), aluminum (Al), and titanium (Ti) or a multilayer film thereof, oxides such as an indium tin oxide (ITO), or conductive carbide-base materials such as carbon nanotube (CN) and graphene.

The organic semiconductor layer 14 may be formed of, for example, polycyclic aromatic hydrocarbon such as pentacene, anthracene, and rubrene, a low-molecular compound such as tetracyanoquinodimethane (TCNQ), or a high-molecular compound such as polyacetylene, poly(3-hexylthiophene) (P3HT), and polyparaphenylene vinylene (PPV).

The channel protection layer 15 covers the organic semiconductor layer 14, and may be formed of, for example, an insulating film material containing silicon silicon (Si), similarly to the above-described planarizing layer 12.

The planarizing layer 16 reduces the irregularity of the board to perform planarization, similarly to the planarizing layer 12 formed on the above-described board body 11. As the material of the planarizing layer 16, similarly to the planarizing layer 12, a silicon oxide ($SiO_2$), a silicon nitride ($Si_3N_4$), an aluminum oxide ($Al_2O_3$), an aluminum nitride (AlN), a tantalum oxide ($Ta_2O_5$), and an aluminum oxynitride ($AlO_XN_{1-X}$ (where X=0.01 to 0.2)) that have insulation property, may be used. In addition, for example, organic materials such as polyvinyl alcohol (PVA), polyvinyl phenol (PVP), a novolac resin, an acrylic resin, and a fluorine-based resin may be used.

The gate electrode 17 controls an electron density in the organic semiconductor layer 14 by a gate voltage applied to the TFT layer 10, to form a channel region in the organic semiconductor layer 14. As the material of the gate electrode 17, metals such as Au, Ag, Cu, Mo, Al, and Ti or a multilayer film thereof, alloys such as aluminum-neodymium, oxides such as ITO, and conductive carbide-base materials such as CN and graphene may be used, similarly to the source-drain electrode 13. The gate electrode 17 may preferably have a thickness of, for example, 10 nm to 500 nm both inclusive.

The display layer 20 has a structure in which an electrophoretic layer 22 as a display body is sandwiched between the pixel electrode 21 and the common electrode 23. The pixel electrode 21 is provided for each pixel on the TFT layer 10, and the common electrode 23 is provided over the surface of an opposing substrate 31. The pixel electrode 21 is electrically connected to a drain electrode 13B of the TFT layer 10 through a through hole 16A provided in the planarizing layer 16. In the present embodiment, the pixel electrode 21 is formed together with the above-described gate electrode 17 on the planarizing layer 16 in the same step, and the pixel electrode 21 and the gate electrode 17 are formed of the same material with the same film thickness. Incidentally, the same film thickness includes variation in manufacturing.

For example, the opposing substrate 31 may be formed of a material similar to that of the board body 11. Note that a moisture proof film to prevent moisture from infiltrating into the display layer 20 and an optical functional film to prevent reflection of outside light on the display surface may be further provided on the opposing substrate 31.

A method of manufacturing the display unit 1 according to the present embodiment will be described below.

(Method of Manufacturing Display Unit 1)

The display unit 1 may be manufactured in the following manner, for example. First, the planarizing layer 12 formed of $SiO_2$, SiN, or the like is formed on the board body 11 (specifically, on the display region of the board body 11) by, for example, a chemical vapor deposition (CVD) method or a sputtering method, and then the TFT layer 10 is formed by a vacuum plasma technique such as a deposition method and a sputtering method, an applying and printing method such as a screen printing method and an inkjet method, and a photolithography technique. Then, the display layer 20 is formed on the TFT layer 10 by, for example, the photolithography technique similarly. After that, the opposing substrate 31 is bonded to the display layer 20. In this way, the display unit 1 illustrated in FIG. 1 is completed. Incidentally, the electrophoretic layer 22 may be formed after the common electrode 23 is formed on the opposing substrate 31, and the display layer 20 having an adhesive layer (not illustrated) provided on the surface of the electrophoretic layer 22 may be bonded to the TFT layer 10. A specific example of the method of manufacturing the display unit 1 is described below with reference to FIG. 2 to FIG. 4.

(Method of Manufacturing TFT Layer 10)

Figure 2:
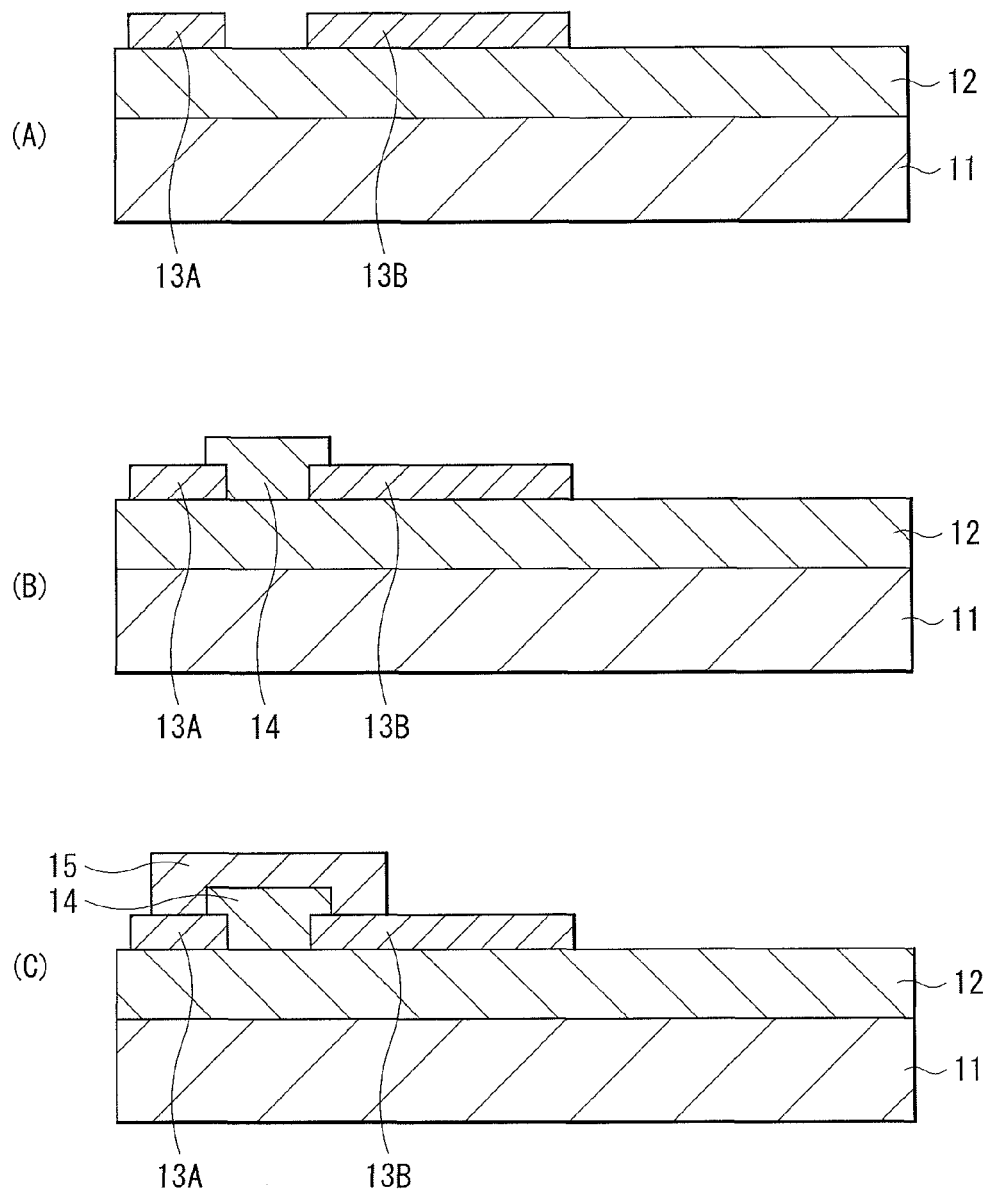
FIGS. 2A through 2C are sectional diagrams illustrating manufacturing steps of the display unit illustrated in FIG. 1.

First, as illustrated in (A) of FIG. 2, a metallic film is formed by, for example, a sputtering method, on the planarizing layer 12 that is provided on the board body 11. Then, a photoresist film is formed (applied) on the metallic film, patterning is performed by the photolithography, and then wet etching or dry etching is performed to form a source electrode 13A and the drain electrode 13B.

Subsequently, as illustrated in (B) of FIG. 2, the organic semiconductor layer 14 is formed between the source electrode 13A and the drain electrode 13B by a vacuum deposition method or an inkjet method using a metal mask. Note that, when the low-molecular material is used as the material of the organic semiconductor layer 14, the vacuum deposition method may be preferably used, and when a soluble polymer is used as the material of the organic semiconductor layer 14, the applying and printing method may be preferably used.

Then, as illustrated in (C) of FIG. 2, a protection film covering the organic semiconductor layer 14 is formed by a spin coat method, a screen printing method, a sputtering method, or the like depending on characteristics of the material. Subsequently, the protection film is patterned into a desired shape by the photolithography or the etching to form the channel protection layer 15. Incidentally, the channel protection layer 15 may be omitted as long as environment resistance of the organic semiconductor layer 14 satisfies a desired property.

Figure 3:
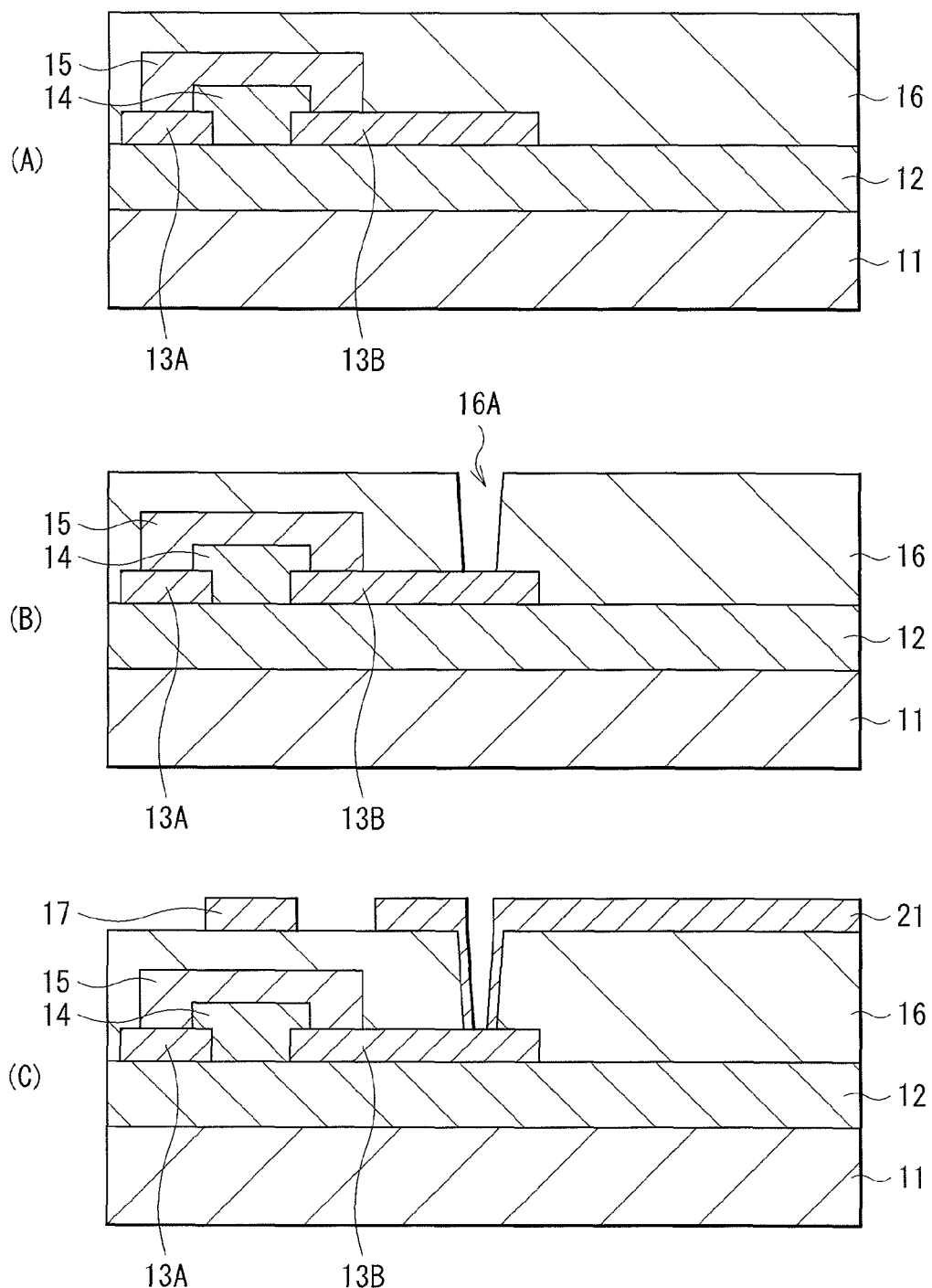
FIGS. 3A through 3C are sectional diagrams illustrating manufacturing steps following the steps of FIG. 2.

Then, as illustrated in (A) of FIG. 3, the planarizing layer 16 is formed on the planarizing layer 12, the source-drain electrode 13, and the channel protection layer 15 by the spin coat method, the screen printing method, or the sputtering method. Subsequently, as illustrated in (B) of FIG. 3, the through hole 16A penetrating to the drain electrode 13B is formed in the planarizing layer 16. Specifically, the through hole 16A is formed by a semiconductor lithography technique and an etching technique.

Then, as illustrated in (C) of FIG. 3, the gate electrode 17 and the pixel electrode 21 are formed on the planarizing layer 16. Specifically, similarly to the above-described method of forming the source-drain electrode 13, a metallic film is formed by, for example, the sputtering method, and a photoresist film is formed on the metallic film. Subsequently, patterning is performed by the photolithography method, and wet etching or dry etching is performed to form the gate electrode 17 and the pixel electrode 21.

Figure 4:
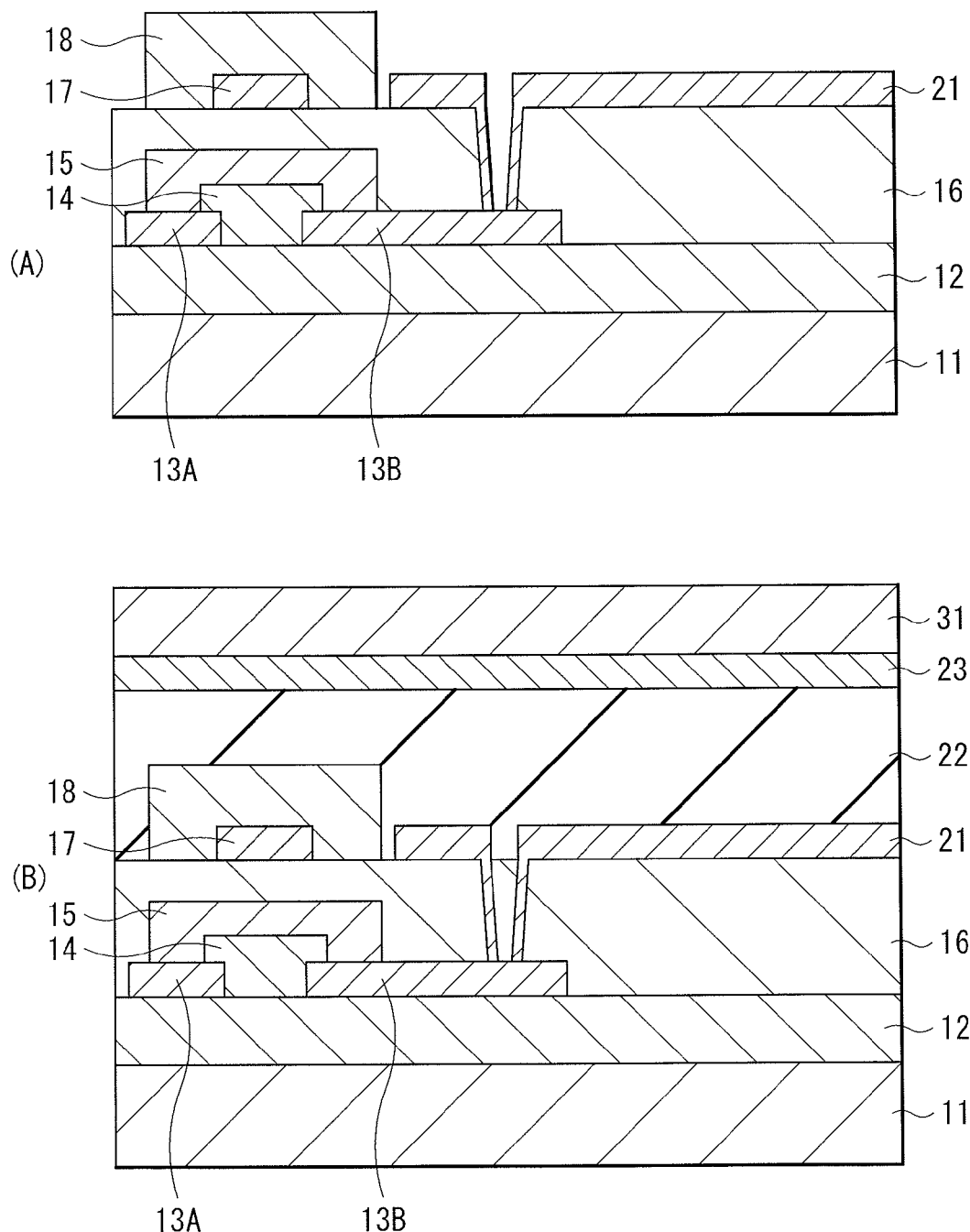
FIGS. 4A and 4B are sectional diagrams illustrating manufacturing steps following the steps of FIG. 3.

Then, as illustrated in (A) of FIG. 4, the protection layer 18 covering the gate electrode 17 is formed by the screen printing method and the inkjet method. As a result, supply of potential from the gate electrode 17 to the display layer 20 is prevented.

Finally, as illustrated in (B) of FIG. 4, the display layer 20 including the electrophoretic layer 22 and the common electrode 23 is formed on the planarizing layer 16, the pixel electrode 21, and the protection layer 18, and then the opposing substrate 31 is bonded to the display layer 20 to complete the display unit 1.

In this way, in the above-described display unit 1, the TFT layer 10 controlling the driving of the display layer 20 that is mounted on the driving circuit board is configured of the top gate type TFT. Further, the gate electrode 17 of the TFT layer 10 is formed in the same step (by the same material with the same film thickness) as the pixel electrode 21 of the display layer 20. As a result, the number of manufacturing steps of the driving circuit board is reduced as compared with an existing driving circuit board in which the gate electrode and the pixel electrode are formed in different steps. In addition, since the gate electrode 17 and the pixel electrode 21 are formed of the same material, usage efficiency of the electrode material is improved.

As described above, in the display unit 1 of the present embodiment, the TFT layer 10 that is provided on the board body 11 of the driving circuit board configuring the display unit 1 is configured of the top gate type, and the gate electrode 17 and the pixel electrode 21 of the display layer 20 are formed in the same step. Therefore, the gate electrode 17 and the pixel electrode 21 are formed of the same material with the same film thickness. In other words, the manufacturing steps are simplified to reduce the number of steps as well as the usage efficiency of the material, in particular, the usage efficiency of the electrode material is improved. Consequently, the manufacturing cost of the display unit 1 is allowed to be reduced.

Moreover, since the gate electrode 17 is covered with the protection film 18 having the insulation property, supply of the potential from the gate electrode 17 to the display layer 20 is prevented, which improves controllability of the image display.

Second to fourth embodiments and modifications 1 and 2 will be described below. Incidentally, like numerals are used to designate substantially like components of the first embodiment, and the description thereof will be appropriately omitted.

2. Second Embodiment

Figure 5:
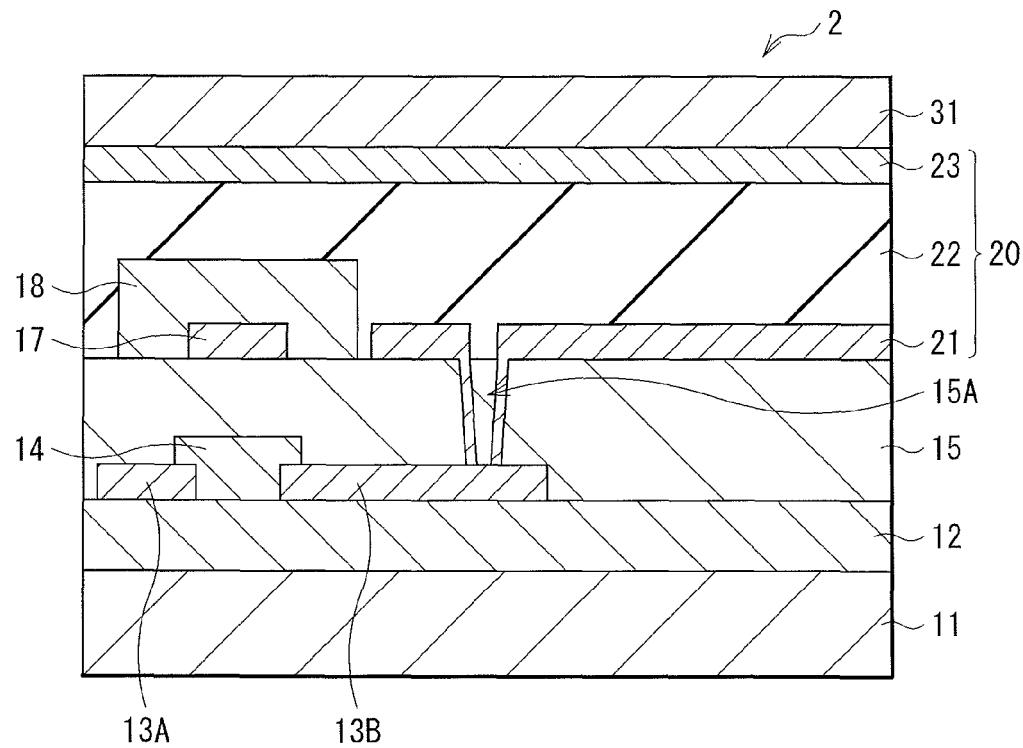
FIG. 5 is a sectional diagram illustrating a structure of a display unit according to a second embodiment of the present disclosure.

FIG. 5 illustrates a sectional structure of a display unit 2 that has the display layer 20 on the driving circuit board, according to a second embodiment of the present disclosure. The display unit 2 according to the present embodiment is different from the first embodiment in that the channel protection layer 15 is made thick (for example, 100 nm to 50 μm both inclusive), the function of the planarizing layer 16 is added to the channel protection layer 15, and thus the planarizing layer 16 is omitted.

As the method of manufacturing the display unit 2, the organic semiconductor layer 14 is formed on the board body 11 in a similar way to the display unit 1 according to the above-described first embodiment, and then the channel protection layer 15 is formed to have a thickness of, for example, 1 μm. Next, a through hole 15A penetrating to the drain electrode 13B is formed by the semiconductor lithography technique and the etching technique in a way similar to the above-described method of forming the through hole 16A of the planarizing layer 16. After that, similarly to the above-described manufacturing steps, the gate electrode 17 and the pixel electrode 21 are formed in the same step, and then the protection film 18 that covers the gate electrode 17, and the electrophoretic layer 22 and the common electrode 23 are formed. Finally, the opposing substrate 31 is bonded to complete the display unit 2.

As described above, in the present embodiment, since the channel protection layer 15 is formed to be a thick film and a function as the planarizing layer reducing the irregularity of the board is added to the channel protection layer 15, the step of patterning the channel protection layer 15 and the step of forming the planarizing layer are omitted. In other words, the number of steps is allowed to be further reduced as compared with the above-described first embodiment.

3. Third Embodiment

Figure 6:
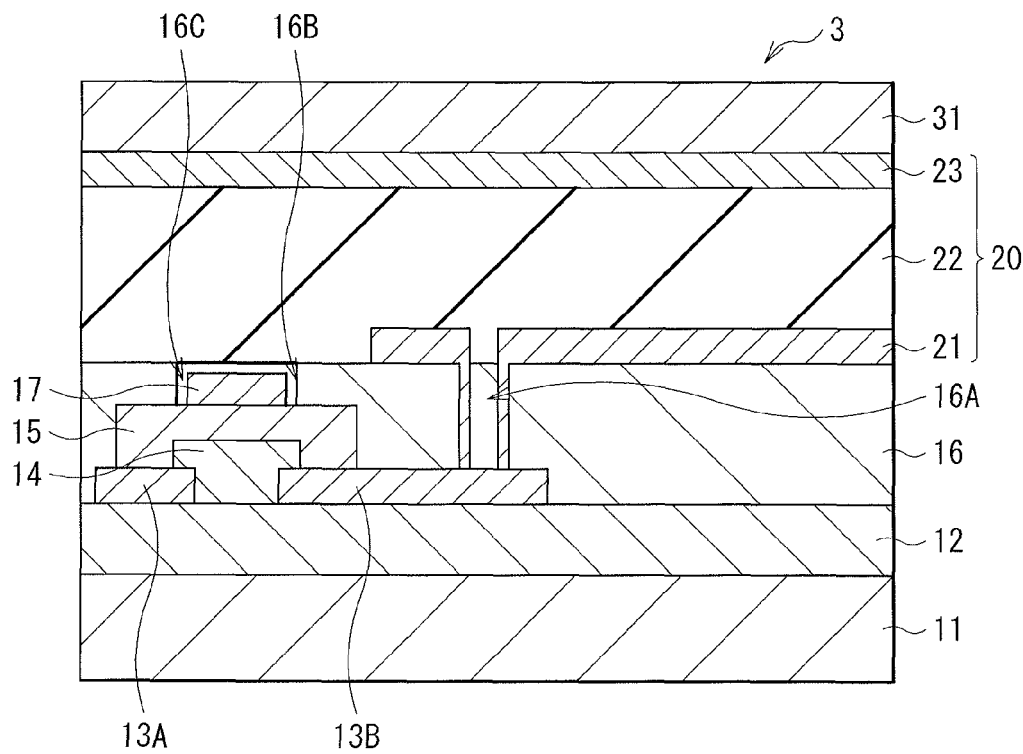
FIG. 6 is a sectional diagram illustrating a structure of a display unit according to a third embodiment of the present disclosure.

FIG. 6 illustrates a sectional structure of a display unit 3 that has the display layer 20 on the driving circuit board, according to a third embodiment of the present disclosure. The display unit 3 according to the present embodiment is different from the above-described first and second embodiments in that an opening 16B is formed at a position corresponding to the organic semiconductor layer 14 on the planarizing layer 16, and the gate electrode 17 is formed in the opening 16B. Note that a gap 16C is formed around the gate electrode 17, and thus the insulation property with the surroundings, in particular, with the pixel electrode 21 and the electrophoretic layer 22 is maintained.

Figure 7:
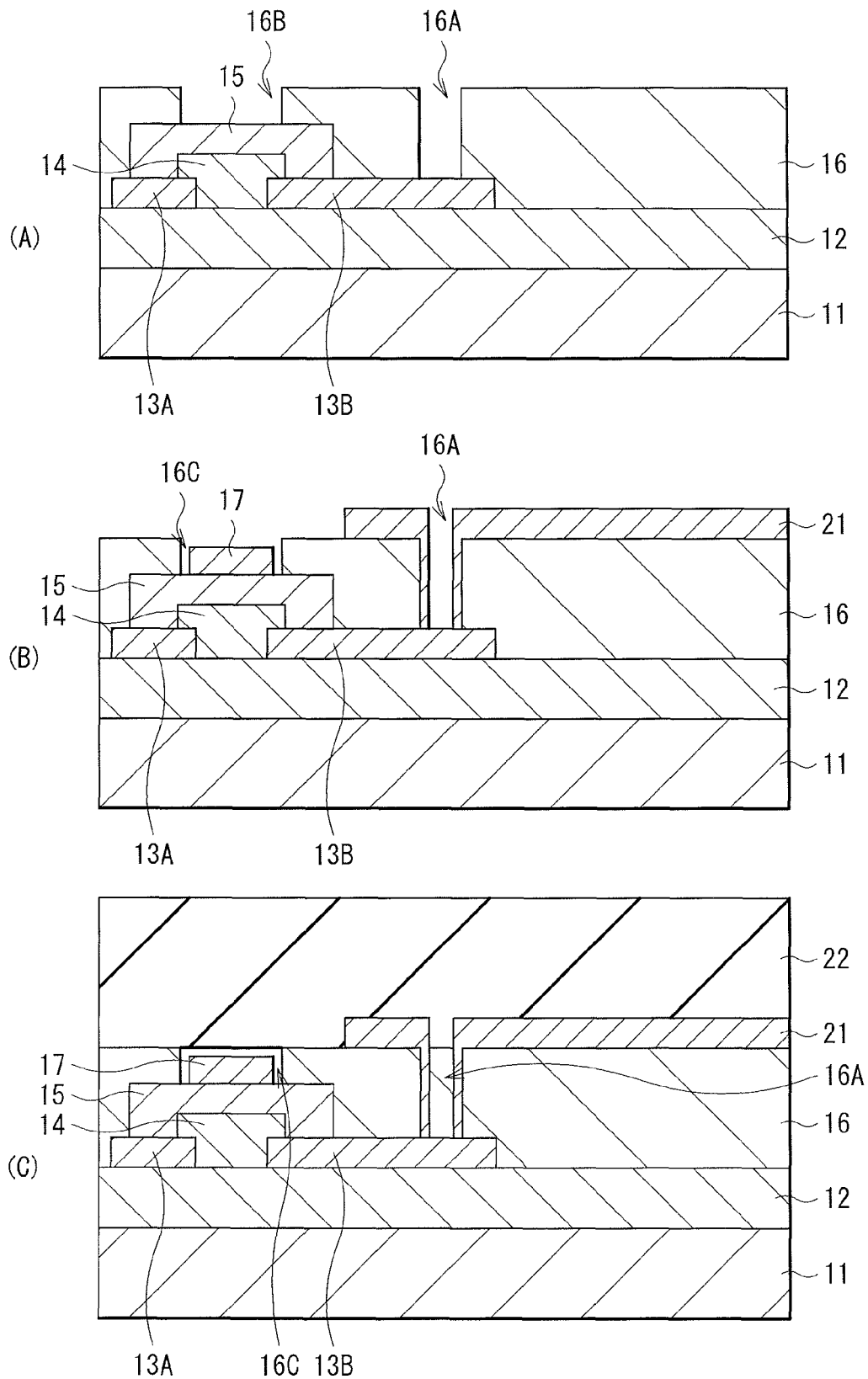
FIGS. 7A through 7C are sectional diagrams illustrating manufacturing steps of the display unit illustrated in FIG. 6.

As the method of manufacturing the display unit 3, the planarizing layer 16 is formed on the board body 11 in a similar way to the above-described first embodiment, and then, for example, as illustrated in (A) of FIG. 7, the opening 16B is formed on the planarizing layer 16 at the same time as the through hole 16A, by the semiconductor lithography technique and the etching technique. Subsequently, as illustrated in (B) of FIG. 7, a metallic film is formed by, for example, the deposition method or the sputtering method, and then patterning of the metallic film is performed by the semiconductor lithography technique. As a result, the gate electrode 17 is formed in the through hole 16B, namely, on the channel protection layer 15, and the pixel electrode 21 is formed on the planarizing layer 16. Note that although the opening 16B penetrates the planarizing layer 16 and thus the surface of the channel protection layer 15 is exposed, the opening 16B does not necessarily penetrate the planarizing layer 16. More specifically, as described above, since it is only necessary that the gap 16C is formed between the gate electrode 17 and the pixel electrode 21 and between the gate electrode 17 and the electrophoretic layer 22 to maintain the insulation property, the planarizing layer 16 may be remained as long as the depth of the opening 16B is larger than the thickness of the gate electrode 17. Incidentally, a distance between the gate electrode 17 and the electrophoretic layer 22 may be preferably equal to or larger than 100 nm, without limitation. In addition, the opening 16B is etched vertically to the board surface in this case, however may be etched in a forward tapered shape or a reversed tapered shape without limitation. Etching the opening 16B in the revered tapered shape allows separate formation from the pixel electrode 21 more surely. Subsequently, after the gate electrode 17 and the pixel electrode 21 are formed, as illustrated in (C) of FIG. 1, the electrophoretic layer 22 and the common electrode 23 are formed by a method similar to that in the above-described first embodiment, and the opposing substrate 31 is finally bonded to complete the display unit 3 illustrated in FIG. 6.

In the present embodiment, after the planarizing layer 16 is formed, the opening 16B is formed together with the through hole 16A in the planarizing layer 16, and the gate electrode 17 is formed in the opening 16B. Therefore, the insulation property between the gate electrode 17 and the pixel electrode 21 and the insulation property between the gate electrode 17 and the electrophoretic layer 22 are allowed to be maintained without the protection layer 18 covering the gate electrode 17 that is formed in the display unit 1 according to the above-described first embodiment. Therefore, the number of steps is recued as compared with the above-described first embodiment as well as used amount of the insulating material and the like of the protection layer 18 that is formed on the gate electrode 17 is suppressed, which further reduces the manufacturing cost.

Moreover, providing a cut as with the opening 16B in the planarizing layer 16 that has relatively large thickness in the display unit 3 allows the stress of the planarizing layer 16 to be relaxed. In other words, flexibility of the display unit 3 in the case where a flexible board is used as the board body 11 is improved.

4. Fourth Embodiment

Figure 8:
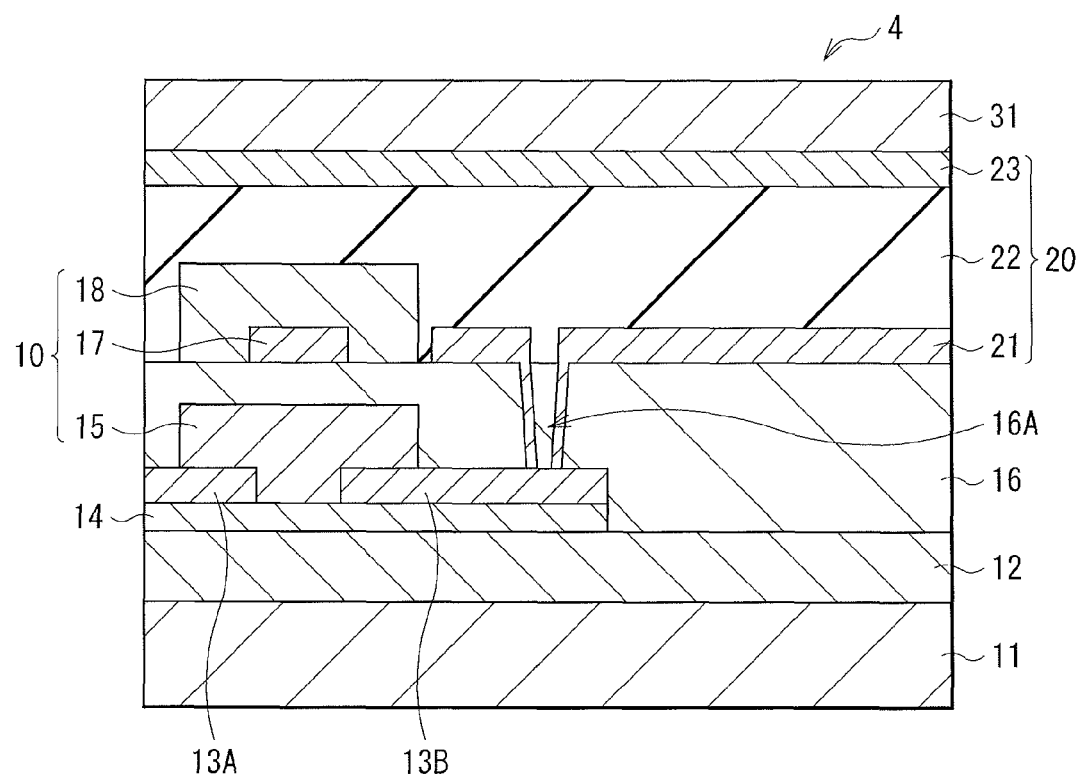
FIG. 8 is a sectional diagram illustrating a structure of a display unit according to a fourth embodiment of the present disclosure.

FIG. 8 illustrates a sectional structure of a display unit 4 that has the display layer 20 on the driving circuit board, according to a fourth embodiment of the present disclosure. The display unit 4 in the present embodiment is different from the above-described first to third embodiments in that the display unit 4 has a top contact structure, namely, the organic semiconductor layer 14 is formed on the board body 11 (in this example, on the planarizing layer 12), and the source-drain electrode 13 is formed directly on the organic semiconductor layer 14.

Figure 9:
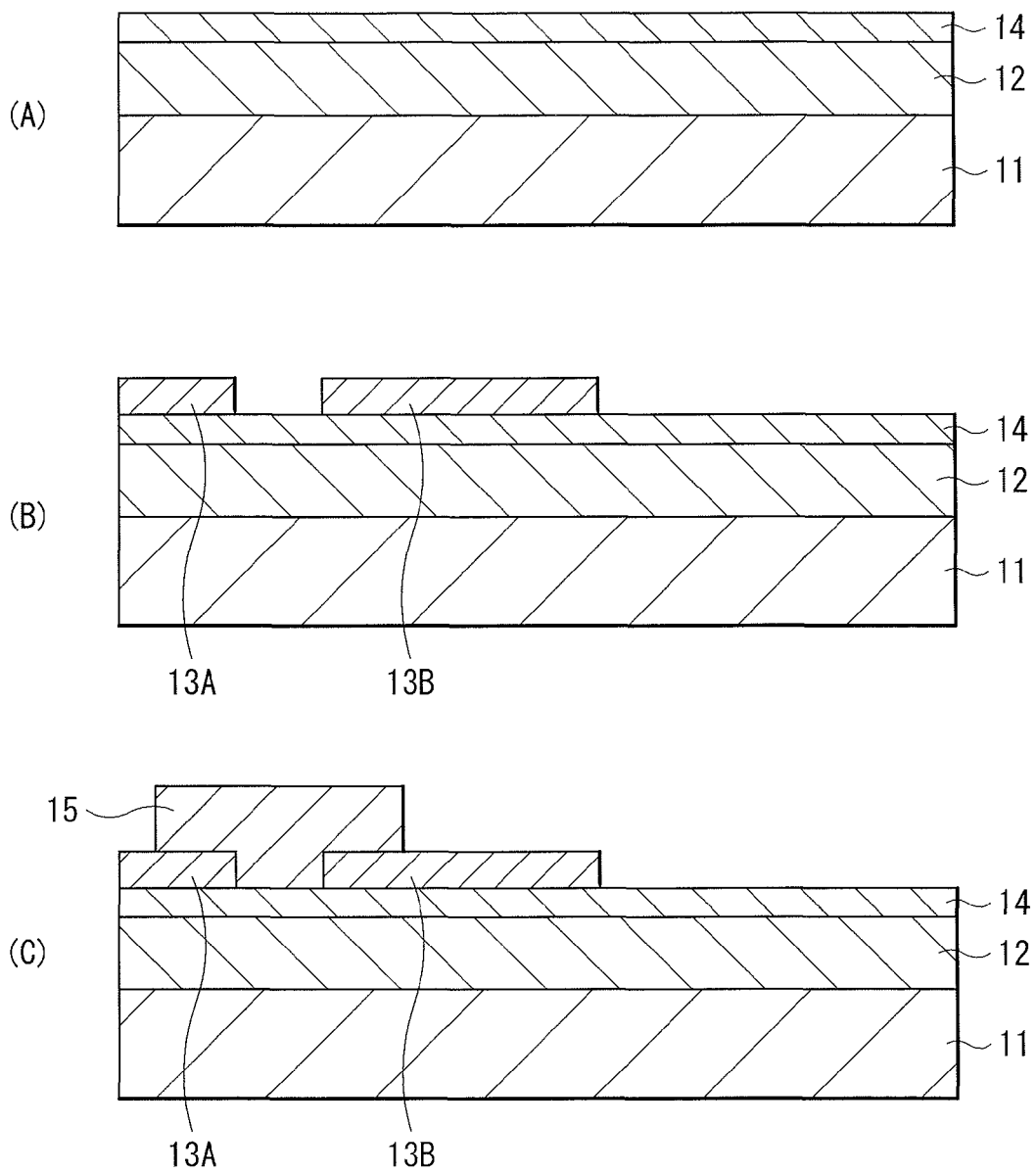
FIGS. 9A through 9C are sectional diagrams illustrating manufacturing steps of the display unit illustrated in FIG. 8.
Figure 10:
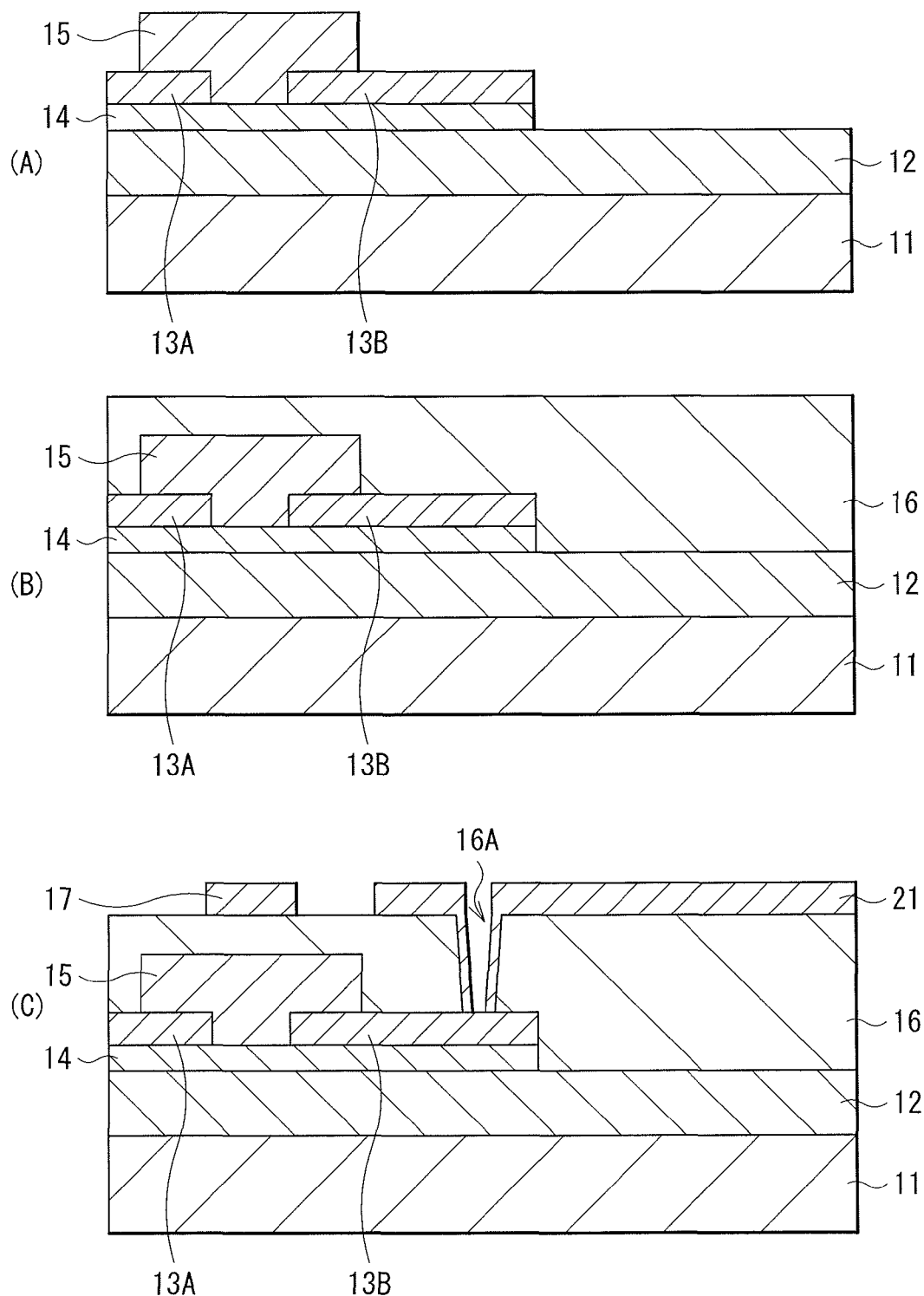
FIGS. 10A through 10C are sectional diagrams illustrating manufacturing steps following the steps of FIG. 9.
Figure 11:
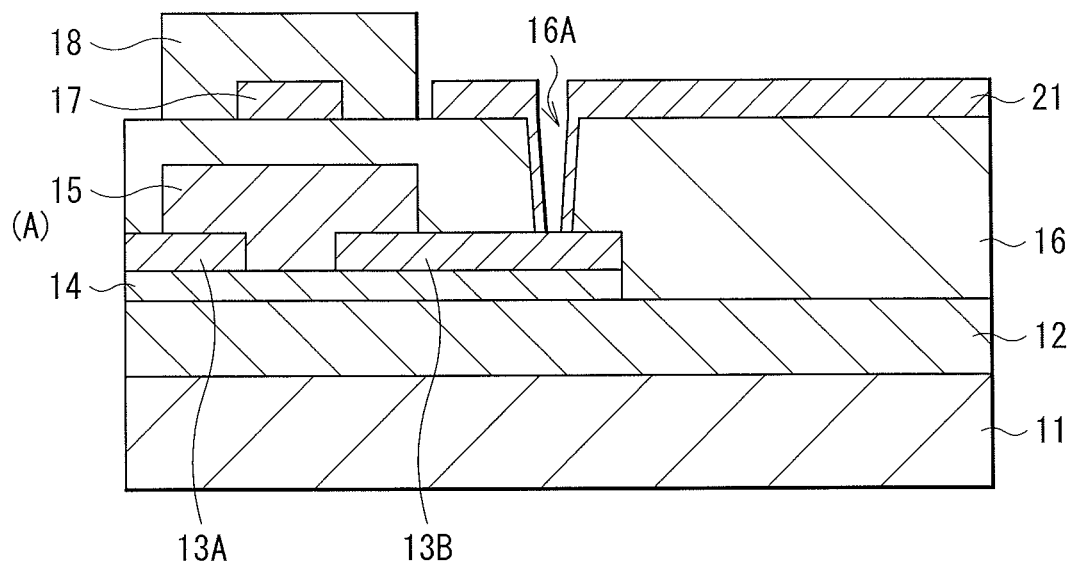
FIGS. 11A and 11B are sectional diagrams illustrating manufacturing steps following the steps of FIG. 10.
Figure 11:
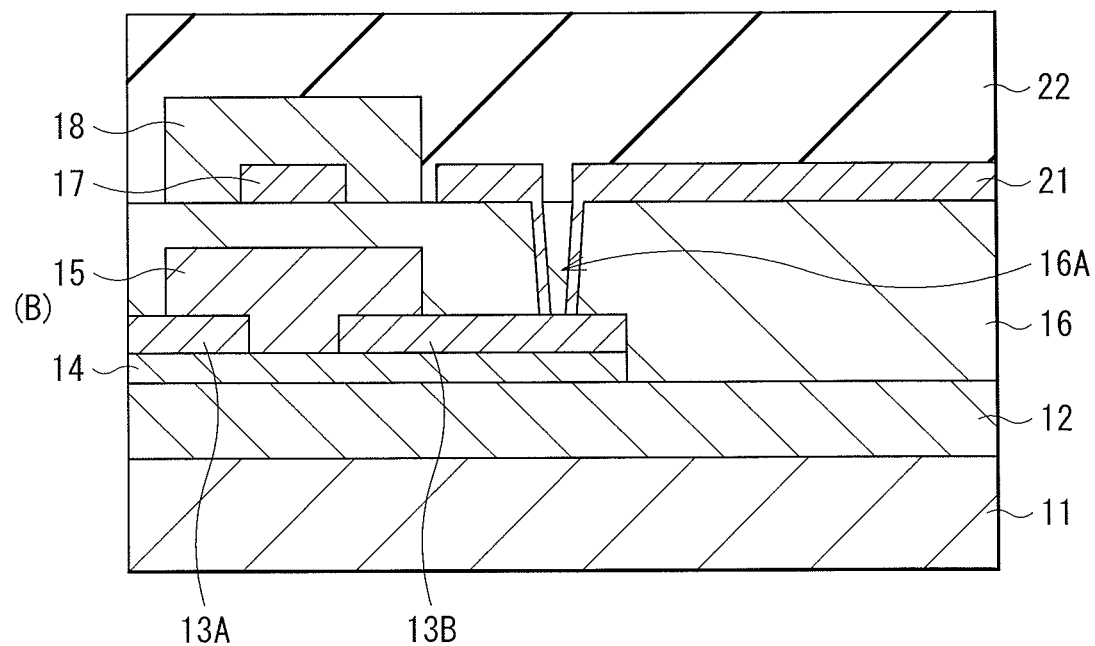

As the method of manufacturing the display unit 4, as illustrated in (A) of FIG. 9, first, the organic semiconductor layer 14 is formed on the planarizing layer 12 that is formed on the board body 11. More specifically, the organic semiconductor layer 14 is formed on the planarizing layer 12 by, for example, the vacuum deposition method and the inkjet method using a metal mask, and then the source-drain electrode 13 is formed on the organic semiconductor layer 14 as illustrated in (B) of FIG. 9. Subsequently, as illustrated in (C) of FIG. 9, the channel protection layer 15 is formed so as to cover the organic semiconductor layer 14 exposed between the source electrode 13A and the drain electrode 13B, and then the patterning of the organic semiconductor layer 14 is performed by the lithography technique and the etching technique as illustrated in (A) of FIG. 10. After that, as described in the above-described first embodiment, the planarizing layer 16 is formed so as to planarize the irregularity of the board as illustrated in (B) of FIG. 10, and then the through hole 16A penetrating to the drain electrode 13B is formed in the planarizing layer 16, and the gate electrode 17 and the pixel electrode 21 are formed on the planarizing layer 16, as illustrated in (C) of FIG. 10. Next, the gate electrode 17 is covered with the protection layer 18 as illustrated in (A) of FIG. 11, and then the electrophoretic layer 22 is formed on the protection film 18 and the pixel electrode 21 as illustrated in (B) of FIG. 11. Finally, the common electrode 23 is formed on the electrophoretic layer 22, and the opposing substrate 31 is bonded to complete the display unit 4 illustrated in FIG. 8.

In the present embodiment, since the source-drain electrode 13 for formation of the channel is formed directly on the organic semiconductor layer 14, an effect of improving semiconductor characteristics is exhibited, in addition to the effects in the above-described first embodiment.

5. Modification 1

Figure 12:
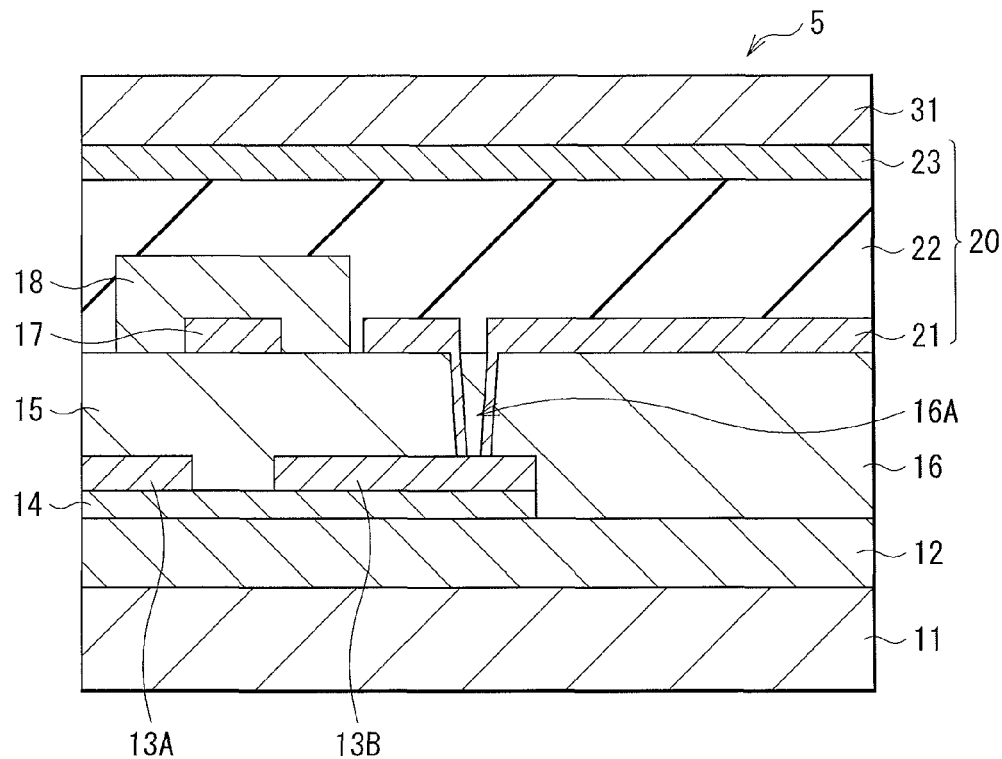
FIG. 12 is a sectional diagram illustrating a structure of a display unit according to a modification 1 of the present disclosure.

FIG. 12 illustrates a sectional structure of a display unit 5 that has the display layer 20 on the driving circuit board, according to a modification 1. The display unit 5 has the top contact structure in which the organic semiconductor layer 14 is formed between the planarizing layer 12 on the board body 11 and the source-drain electrode 13, similarly to the above-described fourth embodiment. The present modification is different from the above-described first to fourth embodiments in that the channel protection layer 15 added with a function as a planarizing layer is formed as a thick film between the source-drain electrode 13 and the gate electrode 17 and between the source-drain electrode 13 and the pixel electrode 21.

In the present modification, the organic semiconductor layer 17 is positioned so as to configure the top contact structure, and the channel protection layer 15 is made thick to have a function as a planarizing layer. Therefore, in the display unit 5 in the present modification 5, semiconductor characteristics are improved, and manufacturing steps are simplified to allow further reduction of the manufacturing cost.

6. Modification 2

Figure 13:
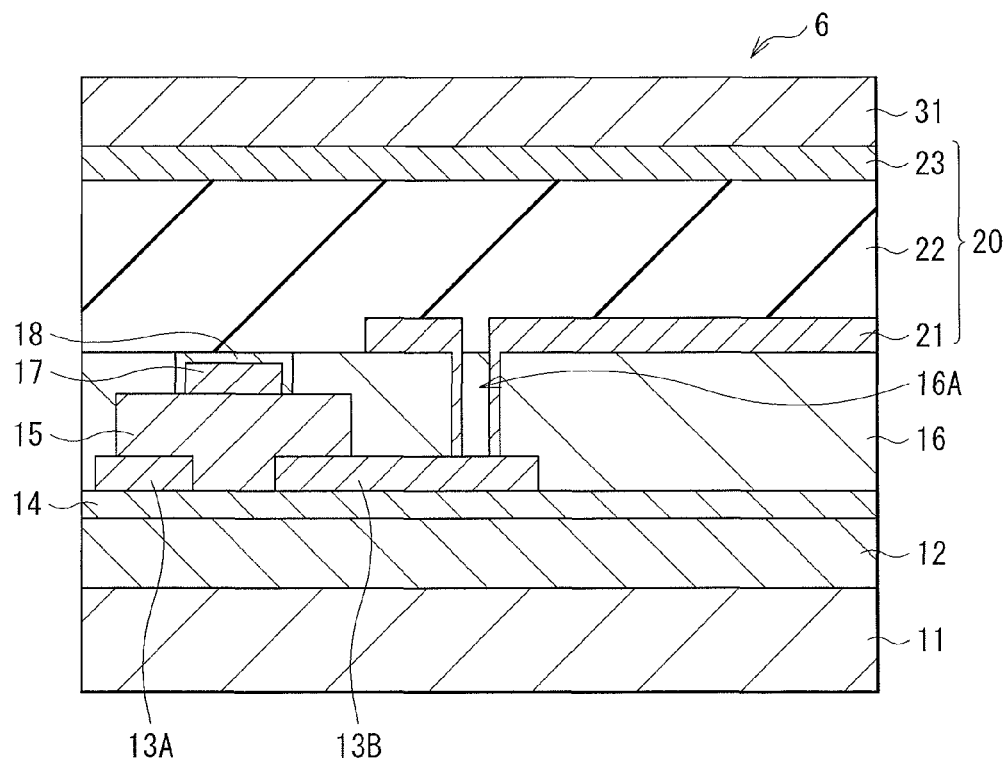
FIG. 13 is a sectional diagram illustrating a structure of a display unit according to a modification 2 of the present disclosure.

FIG. 13 illustrates a sectional structure of a display unit 6 that has the display layer 20 on the driving circuit board, according to a modification 2. The display unit 6 has the top contact structure in which the organic semiconductor layer 14 is formed between the planarizing layer 12 and the source-drain electrode 13, similarly to the above-described fourth embodiment and the like. The present modification is different from the above-described first to fourth embodiments and the above-described modification 1 in that the opening 16B is formed at a position corresponding to the organic semiconductor layer 14 on the planarizing layer 16 that is formed on the source-drain electrode 13, the channel protection layer 15, and the like, and the gate electrode 17 is formed in the opening 16B.

In the present modification, the organic semiconductor layer 17 is positioned so as to configure the top contact structure, the opening 16B is provided at the position corresponding to the organic semiconductor layer 14 on the planarizing layer 16, and the gate electrode 17 is formed in the opening 16B. Therefore, insulation between the gate electrode 17 and the pixel electrode 21 and insulation between the gate electrode 17 and the electrophoretic layer 22 are allowed to be maintained without forming an insulating protection film on the gate electrode 17 in the display unit 6. In other words, in the display unit 6 of the present modification, semiconductor characteristics are improved. Furthermore, the number of manufacturing steps is reduced as well as used amount of the insulating material and the like is suppressed, which further reduces the manufacturing cost.

Hereinbefore, although the present technology has been described with referring to the first to fourth embodiments and the modifications 1 and 2, the present technology is not limited to the above-described embodiments and the like, and various modifications may be made. For example, in the above-described embodiments and the like, an electrophoretic display that has an electrophoretic layer as the display layer 20 between the pixel electrode and the common electrode has been described, however, the display layer 20 may be configured of a liquid crystal, organic electro luminescence (EL), inorganic EL, or the like.

In addition, in the above-described embodiments and the like, the structure of the display unit 1 has been specifically described. However, all of the layers are not necessarily provided, and other layers may be further provided.

Further, the driving circuit board and the display units 1 to 6 each including the driving circuit board that are described in the above-described embodiments and the like may be used in electronic apparatuses described in the following application examples 1 to 6, for example, Incidentally, the configurations of the electronic apparatuses described below are merely examples, and thus the configuration may be modified as appropriate.

7. Application Examples

Application Example 1

Figure 14:
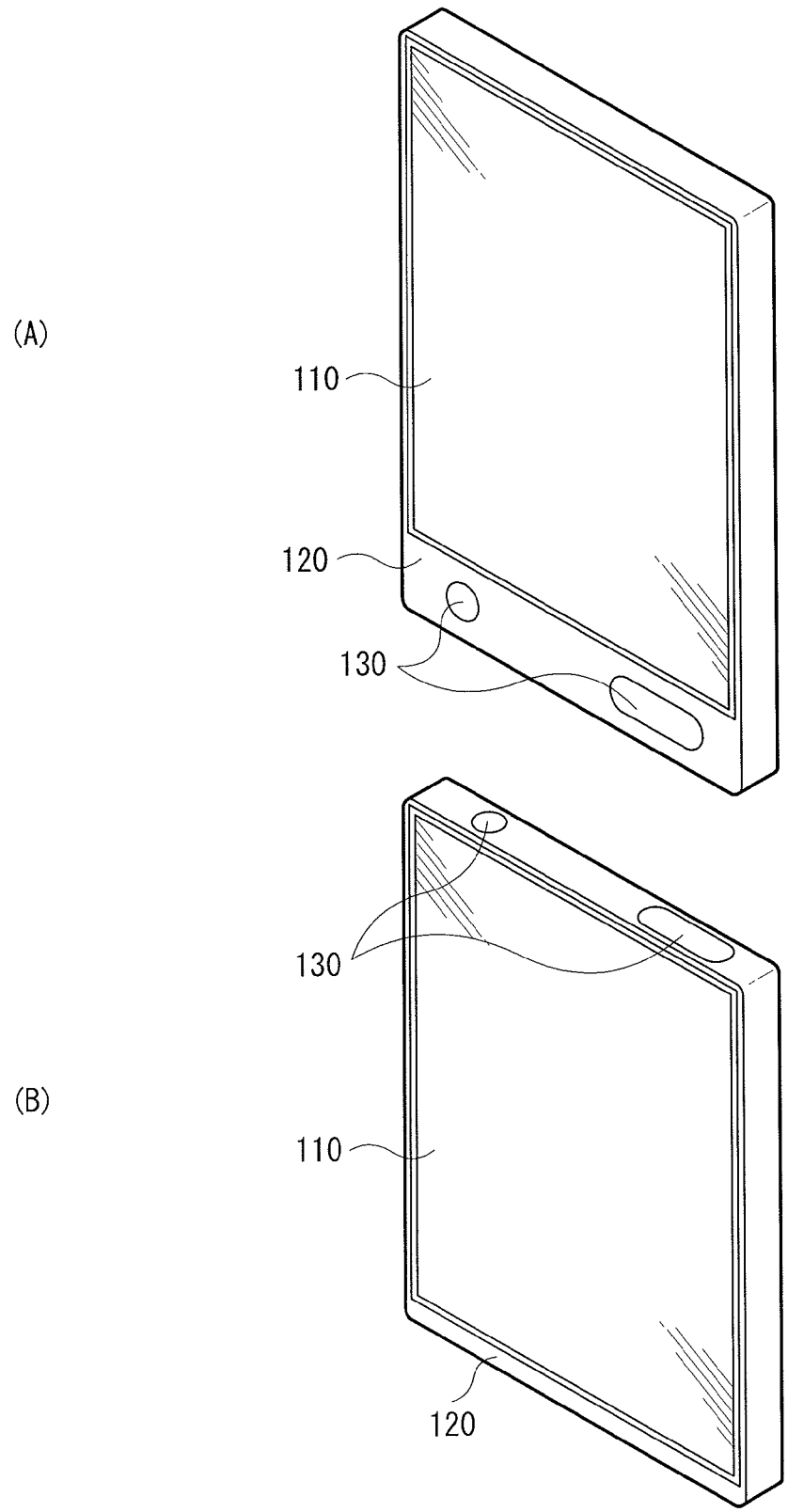
FIG. 14 (A) of FIG. 14 is a perspective view illustrating an appearance of an application example 1 as viewed from a back side thereof, and (B) of FIG. 14 is a perspective view illustrating an appearance of the application example 1 as viewed from a front side thereof.

(A) and (B) of FIG. 14 each illustrate an appearance configuration of an electronic book. For example, the electronic book may include a display section 110, a non-display section 120, and an operation section 130. Note that the operation section 130 may be provided on a front surface of the non-display section 120 (enclosure) as illustrated in (A), or may be provided on a top surface as illustrated in (B). Incidentally, the display unit may be mounted on a PDA or the like that has a configuration similar to that of the electronic book illustrated in FIG. 14.

Application Example 2

Figure 15:
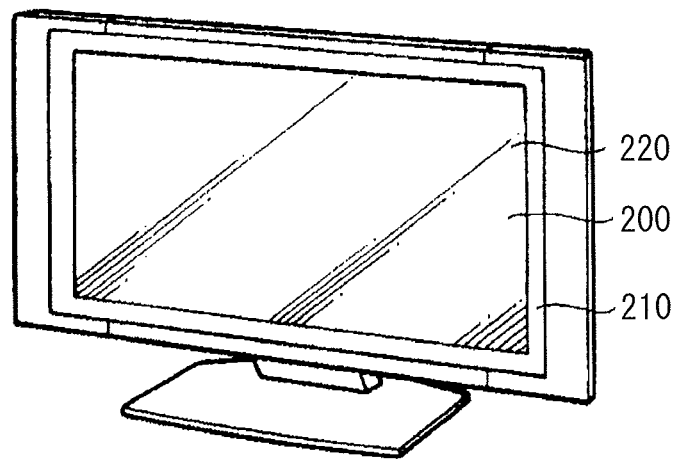
FIG. 15 is a perspective view illustrating an appearance of an application example 2.

FIG. 15 illustrates an appearance configuration of a television apparatus. For example, the television apparatus may include a picture display screen section 200 that includes a front panel 210 and a filter glass 220.

Application Example 3

Figure 16:
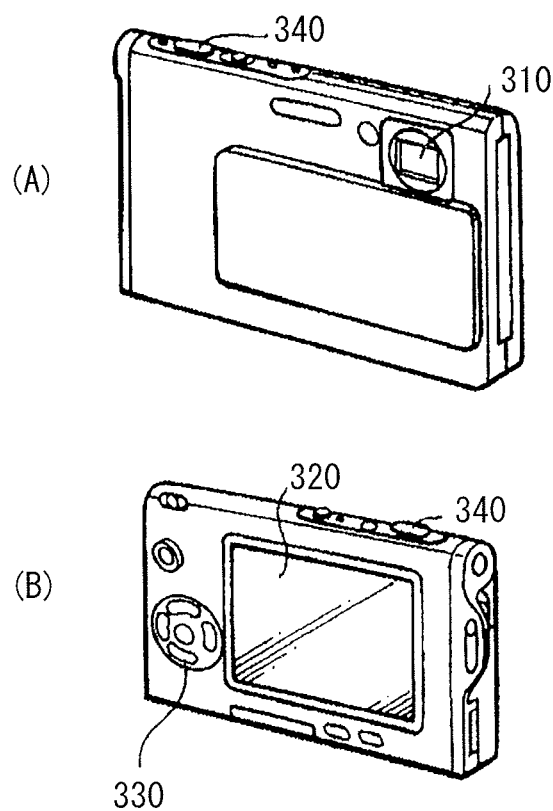
FIG. 16 (A) of FIG. 16 is a perspective view illustrating an appearance of an application example 3 as viewed from a front side thereof, and (B) of FIG. 16 is a perspective view illustrating an appearance of the application example 3 as viewed from a back side thereof.

(A) and (B) of FIG. 16 each illustrate an appearance configuration of a digital still camera, where (A) and (B) illustrate a front surface and a back surface, respectively. For example, the digital still camera may include a light emitting section 310 for flash, a display section 320, a menu switch 330, and a shutter button 340.

Application Example 4

Figure 17:
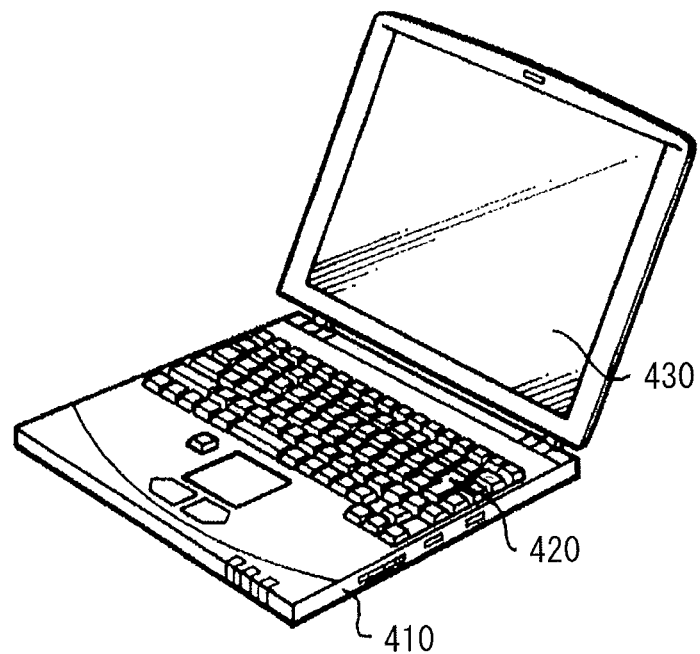
FIG. 17 is a perspective view illustrating an appearance of an application example 4.

FIG. 17 illustrates an appearance configuration of a notebook personal computer. For example, the notebook personal computer may include a main body 410, a keyboard for input operation of characters and the like, and a display section 430 displaying an image.

Application Example 5

Figure 18:
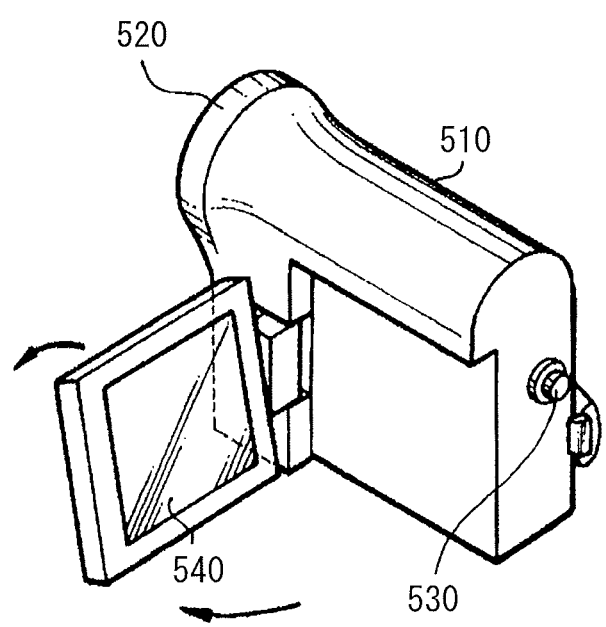
FIG. 18 is a perspective view illustrating an appearance of an application example 5.

FIG. 18 illustrates an appearance configuration of a video camera. For example, the video camera may include a main body section 510, a lens 520 for capturing an object image provided on a front surface of the main body section 510, a start and stop switch 530 for capturing images, and a display section 540.

Application Example 6

Figure 19:
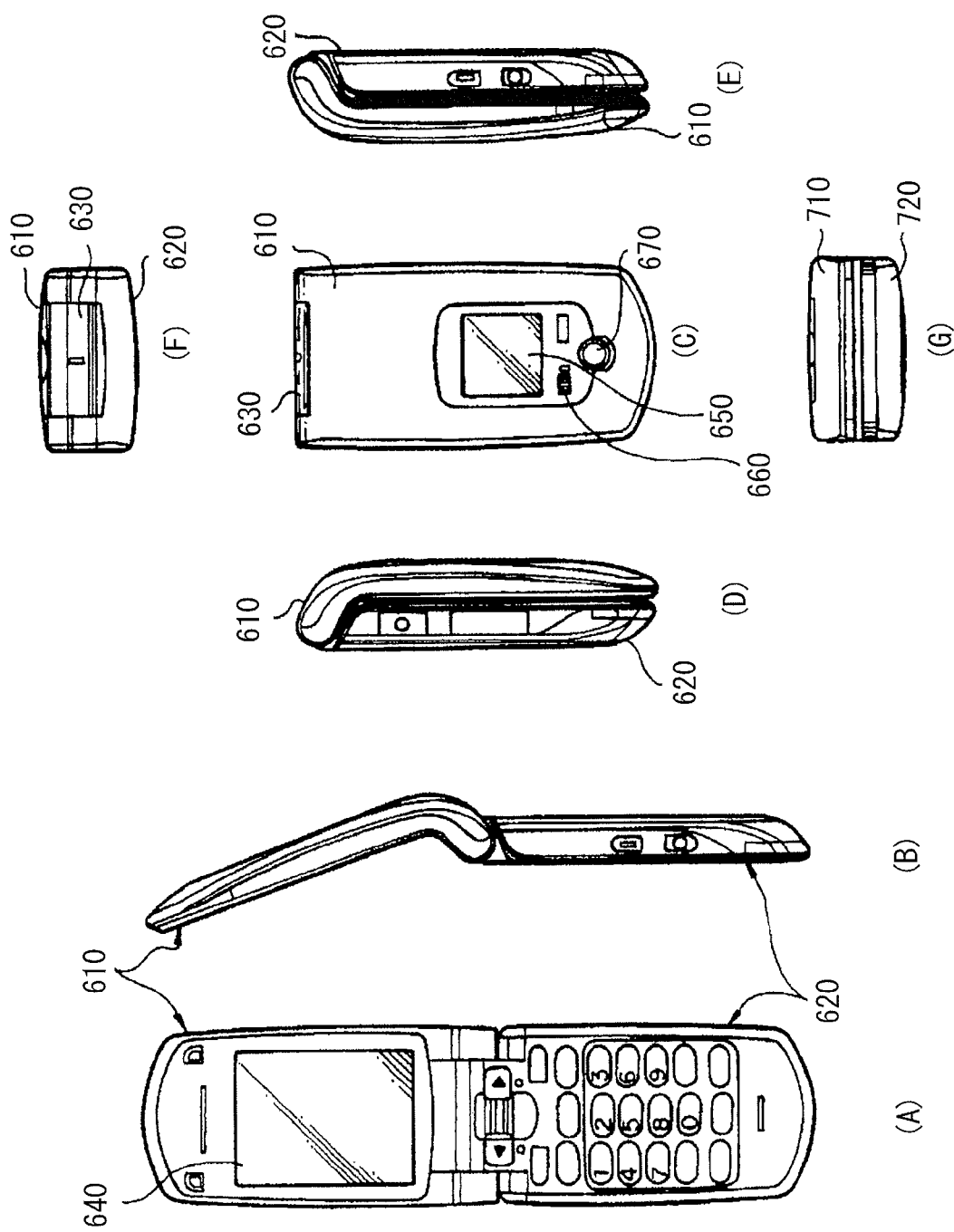
FIG. 19 (A) of FIG. 19 is a front view of an application example 6 in an open state, (B) of FIG. 19 is a side sectional view thereof, (C) of FIG. 19 is a front view in a closed state, (D) of FIG. 19 is a left side view, (E) of FIG. 19 is a right side view, (F) of FIG. 19 is a top view, and (G) of FIG. 19 is a bottom view.

(A) to (E) of FIG. 19 each illustrate an appearance configuration of a mobile phone. (A) and (B) illustrate a front surface and a side surface, respectively, of the mobile phone in an open state. (C) to (G) illustrate a front surface, a left side surface, a right side surface, a top surface, and a bottom surface, respectively, of the mobile phone in an closed state. For example, the mobile phone may include an upper enclosure 610 and a lower enclosure 620 that are coupled by a coupling section (a hinge section) 630, and may include a display 640, a sub-display 650, a picture light 660, and a camera 670.

Note that the present disclosure may be configured as follows.

(1) A driving circuit board including:
a pair of source-drain electrodes;
an organic semiconductor layer forming a channel region, and provided in contact with the source-drain electrodes;
an insulating layer formed of one or more layers, the insulating layer having a through hole penetrating to the source-drain electrodes, and the insulating layer being provided on the organic semiconductor layer and the source-drain electrodes;
a gate electrode provided at a position corresponding to the channel region; and
a pixel electrode electrically connected to the source-drain electrodes through the through hole, the pixel electrode being made of a same material as the gate electrode with a same film thickness as the gate electrode, and the pixel electrode being provided on the insulating layer.

(2) The driving circuit board according to (1), wherein the gate electrode and the pixel electrode are adjacent to each other on the insulating layer.

(3) The driving circuit board according to (1) or (2), wherein the insulating layer include at least a first layer and a second layer, the first layer covering the organic semiconductor layer, and the second layer planarizing irregularity formed on a board body provided with the source-drain electrodes.

(4) The driving circuit board according to (3), wherein the second layer has an opening at a position corresponding to the channel region, and the gate electrode is provided in the opening.

(5) The driving circuit board according to (4), wherein the opening has a reversed tapered shape.

(6) The driving circuit board according to (4) or (5), wherein
the opening penetrates the second layer, and
the gate electrode is formed on the first layer.

(7) The driving circuit board according to any one of (1) to (6), wherein the organic semiconductor layer is provided in a gap that is formed by the source-drain electrodes.

(8) The driving circuit board according to any one of (1) to (6), wherein the organic semiconductor layer is provided between the board and the source-drain electrodes.

(9) The driving circuit board according to any one of (1) to (8), wherein the board body has flexibility.

(10) A driving circuit board including:
a pair of source-drain electrodes;
an organic semiconductor layer forming a channel region, and provided in contact with the source-drain electrodes;
an insulating layer formed of one or more layers, the insulating layer having a through hole penetrating to the source-drain electrodes, and the insulating layer being provided on the organic semiconductor layer and the source-drain electrodes;
a gate electrode provided at a position corresponding to the channel region; and
a pixel electrode electrically connected to the source-drain electrodes through the through hole, and provided on the same layer as the gate electrode.

(11) A method of manufacturing a driving circuit board, the method including:
forming source-drain electrodes;
forming an organic semiconductor layer on a part of the source-drain electrodes, the organic semiconductor layer having a channel region;
forming an insulating layer on the source-drain electrodes and the organic semiconductor layer;
forming a through hole in the insulating layer, the through hole penetrating to the source-drain electrodes; and
forming a gate electrode and a pixel electrode on the insulating layer with use of a same material with a same film thickness.

(12) The method of manufacturing the driving circuit board according to (11), wherein in forming the though hole, an opening is formed in the insulating layer corresponding to the channel region.

(13) A method of manufacturing a driving circuit board, the method including:
forming an organic semiconductor layer having a channel region;
forming source-drain electrodes on the organic semiconductor layer;
forming an insulating layer on the source-drain electrodes and the organic semiconductor layer;
forming a through hole in the insulating layer, the through hole penetrating to the source-drain electrodes; and
forming a gate electrode and a pixel electrode on the insulating layer with use of a same material with a same film thickness.

(14) The method of manufacturing the driving circuit board according to (13), wherein in forming the through hole, an opening is formed in the insulating layer corresponding to the channel region.

(15) A display unit provided with a driving circuit board and a display layer driven by the driving circuit board, the driving circuit board including:
a pair of source-drain electrodes;
an organic semiconductor layer forming a channel region, and provided in contact with the source-drain electrodes;
an insulating layer formed of one or more layers, the insulating layer having a through hole penetrating to the source-drain electrodes, and the insulating layer being provided on the organic semiconductor layer and the source-drain electrodes;
a gate electrode provided at a position corresponding to the channel region; and
a pixel electrode electrically connected to the source-drain electrodes through the through hole, the pixel electrode being made of a same material as the gate electrode with a same film thickness as the gate electrode, and the pixel electrode being provided on the insulating layer.

(16) The display unit according to (15), wherein the gate electrode is covered with a protection layer including an insulating material.

(17) The display unit according to (15) or (16), wherein
the insulating layer has an opening at a position corresponding to the channel region, and
the gate electrode is provided in the opening.

(18) The display unit according to (17), wherein the gate electrode provided in the opening has a gap around its periphery.

(19) The display unit according to any one of (15) to (18), wherein the display layer has an electrophoretic layer between a pair of electrodes.

(20) An electronic apparatus provided with a display unit, the display unit being provided with a driving circuit board and a display layer driven by the driving circuit board, the driving circuit board including:
a pair of source-drain electrodes;
an organic semiconductor layer forming a channel region, and provided in contact with the source-drain electrodes;
an insulating layer formed of one or more layers, the insulating layer having a through hole penetrating to the source-drain electrodes, and the insulating layer being provided on the organic semiconductor layer and the source-drain electrodes;
a gate electrode provided at a position corresponding to the channel region; and a pixel electrode electrically connected to the source-drain electrodes through the through hole, the pixel electrode being made of a same material as the gate electrode with a same film thickness as the gate electrode, and the pixel electrode being provided on the insulating layer.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention claimed is:
1. A driving circuit board comprising:
a pair of source-drain electrodes;
an organic semiconductor layer forming a channel region, and provided in contact with the source-drain electrodes;
an insulating layer formed of one or more layers, the insulating layer having a through hole penetrating to the source-drain electrodes, and the insulating layer being provided on the organic semiconductor layer and the source-drain electrodes;
a gate electrode provided at a position corresponding to the channel region; and
a pixel electrode electrically connected to the source-drain electrodes through the through hole, the pixel electrode being made of a same material as the gate electrode with a same film thickness as the gate electrode, and the pixel electrode being provided on the insulating layer.

2. The driving circuit board according to claim 1, wherein the gate electrode and the pixel electrode are adjacent to each other on the insulating layer.

3. The driving circuit board according to claim 1, wherein the insulating layer include at least a first layer and a second layer, the first layer covering the organic semiconductor layer, and the second layer planarizing irregularity formed on a board body provided with the source-drain electrodes.

4. The driving circuit board according to claim 3, wherein the second layer has an opening at a position corresponding to the channel region, and
the gate electrode is provided in the opening.

5. The driving circuit board according to claim 4, wherein the opening has a reversed tapered shape.

6. The driving circuit board according to claim 4, wherein the opening penetrates the second layer, and
the gate electrode is formed on the first layer.

7. The driving circuit board according to claim 1, wherein the organic semiconductor layer is provided in a gap that is formed by the source-drain electrodes.

8. The driving circuit board according to claim 1, wherein the organic semiconductor layer is provided between the board and the source-drain electrodes.

9. The driving circuit board according to claim 1, wherein the board body has flexibility.

10. A driving circuit board comprising:
a pair of source-drain electrodes;
an organic semiconductor layer forming a channel region, and provided in contact with the source-drain electrodes;
an insulating layer formed of one or more layers, the insulating layer having a through hole penetrating to the source-drain electrodes, and the insulating layer being provided on the organic semiconductor layer and the source-drain electrodes;
a gate electrode provided at a position corresponding to the channel region; and
a pixel electrode electrically connected to the source-drain electrodes through the through hole, and provided on the same layer as the gate electrode.

11. A method of manufacturing a driving circuit board, the method comprising:
forming source-drain electrodes;
forming an organic semiconductor layer on a part of the source-drain electrodes, the organic semiconductor layer having a channel region;
forming an insulating layer on the source-drain electrodes and the organic semiconductor layer;
forming a through hole in the insulating layer, the through hole penetrating to the source-drain electrodes; and
forming a gate electrode and a pixel electrode on the insulating layer with use of a same material with a same film thickness.

12. The method of manufacturing the driving circuit board according to claim 11, wherein in forming the though hole, an opening is formed in the insulating layer corresponding to the channel region.

13. A method of manufacturing a driving circuit board, the method comprising:
forming an organic semiconductor layer having a channel region;
forming source-drain electrodes on the organic semiconductor layer;
forming an insulating layer on the source-drain electrodes and the organic semiconductor layer;
forming a through hole in the insulating layer, the through hole penetrating to the source-drain electrodes; and
forming a gate electrode and a pixel electrode on the insulating layer with use of a same material with a same film thickness.

14. The method of manufacturing the driving circuit board according to claim 13, wherein in forming the through hole, an opening is formed in the insulating layer corresponding to the channel region.

15. A display unit provided with a driving circuit board and a display layer driven by the driving circuit board, the driving circuit board comprising:
a pair of source-drain electrodes;
an organic semiconductor layer forming a channel region, and provided in contact with the source-drain electrodes;
an insulating layer formed of one or more layers, the insulating layer having a through hole penetrating to the source-drain electrodes, and the insulating layer being provided on the organic semiconductor layer and the source-drain electrodes;
a gate electrode provided at a position corresponding to the channel region; and
a pixel electrode electrically connected to the source-drain electrodes through the through hole, the pixel electrode being made of a same material as the gate electrode with a same film thickness as the gate electrode, and the pixel electrode being provided on the insulating layer.

16. The display unit according to claim 15, wherein the gate electrode is covered with a protection layer including an insulating material.

17. The display unit according to claim 15, wherein
the insulating layer has an opening at a position corresponding to the channel region, and
the gate electrode is provided in the opening.

18. The display unit according to claim 17, wherein the gate electrode provided in the opening has a gap around its periphery.

19. The display unit according to claim 15, wherein the display layer has an electrophoretic layer between a pair of electrodes.

20. An electronic apparatus provided with a display unit, the display unit being provided with a driving circuit board and a display layer driven by the driving circuit board, the driving circuit board comprising:
a pair of source-drain electrodes;
an organic semiconductor layer forming a channel region, and provided in contact with the source-drain electrodes;
an insulating layer formed of one or more layers, the insulating layer having a through hole penetrating to the source-drain electrodes, and the insulating layer being provided on the organic semiconductor layer and the source-drain electrodes;
a gate electrode provided at a position corresponding to the channel region; and
a pixel electrode electrically connected to the source-drain electrodes through the through hole, the pixel electrode being made of a same material as the gate electrode with a same film thickness as the gate electrode, and the pixel electrode being provided on the insulating layer.

* * * * *